US009123714B2

(12) United States Patent
Pachamuthu et al.

(10) Patent No.: US 9,123,714 B2
(45) Date of Patent: Sep. 1, 2015

(54) METAL LAYER AIR GAP FORMATION

(71) Applicant: SanDisk Technologies Inc., Plano, TX (US)

(72) Inventors: Jayavel Pachamuthu, Milpitas, CA (US); Hiroyuki Kinoshita, San Jose, CA (US); Vinod R. Purayath, Santa Clara, CA (US); George Matamis, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 12 days.

(21) Appl. No.: 13/768,934

(22) Filed: Feb. 15, 2013

(65) Prior Publication Data

US 2013/0214415 A1 Aug. 22, 2013

Related U.S. Application Data

(60) Provisional application No. 61/599,923, filed on Feb. 16, 2012.

(51) Int. Cl.
*H01L 23/498* (2006.01)
*H01L 21/768* (2006.01)
*H01L 27/115* (2006.01)

(52) U.S. Cl.
CPC ...... *H01L 23/49866* (2013.01); *H01L 21/7682* (2013.01); *H01L 21/76871* (2013.01); *H01L 27/11524* (2013.01); *H01L 27/11531* (2013.01);
(Continued)

(58) Field of Classification Search
CPC .............. H01L 21/764; H01L 21/7682; H01L 27/11524; H01L 27/11531; H01L 23/49866; H01L 21/76871; H01L 27/11548; H01L 2924/0002; H01L 2924/00
See application file for complete search history.

(56) References Cited

U.S. PATENT DOCUMENTS 7,511,994 B2 3/2009 Aritome
7,737,015 B2 6/2010 Kohli et al.
(Continued)

FOREIGN PATENT DOCUMENTS

EP 1418618 A2 5/2004
EP 1672687 A1 6/2006
EP 1835530 A2 9/2007

OTHER PUBLICATIONS

U.S. Appl. No. 13/472,337, filed May 15, 2012.
(Continued)

*Primary Examiner* — Kyoung Lee
*Assistant Examiner* — Ratisha Mehta
(74) *Attorney, Agent, or Firm* — Vierra Magen Marcus LLP

(57) ABSTRACT

Air gaps are provided to reduce interference and resistance between metal bit lines in non-volatile memory structures. Metal vias can be formed that are electrically coupled with the drain region of an underlying device and extend vertically with respect to the substrate surface to provide contacts for bit lines that are elongated in a column direction above. The metal vias can be separated by a dielectric fill material. Layer stack columns extend in a column direction over the dielectric fill and metal vias. Each layer stack column includes a metal bit line over a nucleation line. Each metal via contacts one of the layer stack columns at its nucleation line. A low temperature dielectric liner extends along sidewalls of the layer stack columns. A non-conformal dielectric overlies the layer stack columns defining a plurality of air gaps between the layer stack columns.

21 Claims, 16 Drawing Sheets

(52) U.S. Cl.
CPC ... *H01L 27/11548* (2013.01); *H01L 2924/0002* (2013.01)

(56) References Cited

U.S. PATENT DOCUMENTS

| | | | |
|---|---|---|---|
| 7,795,080 | B2 | 9/2010 | Orimoto et al. |
| 7,800,155 | B2 | 9/2010 | Matsuno |
| 7,863,190 | B1 | 1/2011 | Papasouliotis et al. |
| 7,884,415 | B2 | 2/2011 | Nagano |
| 7,905,959 | B2 | 3/2011 | Tzu et al. |
| 8,053,347 | B2 | 11/2011 | Kang et al. |
| 8,129,264 | B2 | 3/2012 | Kim et al. |
| 8,325,529 | B2 | 12/2012 | Huang et al. |
| 8,362,542 | B2 | 1/2013 | Kang et al. |
| 8,383,479 | B2 | 2/2013 | Purayath |
| 2006/0194390 | A1 | 8/2006 | Imai et al. |
| 2007/0184615 | A1 | 8/2007 | Brazzelli et al. |
| 2007/0257305 | A1 | 11/2007 | Sasago et al. |
| 2008/0003743 | A1 | 1/2008 | Lee |
| 2008/0283898 | A1 | 11/2008 | Kuniya |
| 2009/0042383 | A1* | 2/2009 | Kim et al. ............ 438/619 |
| 2009/0059669 | A1 | 3/2009 | Toriyama et al. |
| 2009/0212352 | A1 | 8/2009 | Aoyama et al. |
| 2009/0236682 | A1* | 9/2009 | Boubekeur et al. ......... 257/506 |
| 2009/0267131 | A1 | 10/2009 | Nitta |
| 2010/0019311 | A1 | 1/2010 | Sato et al. |
| 2010/0127320 | A1 | 5/2010 | Nishihara et al. |
| 2010/0178729 | A1* | 7/2010 | Yoon et al. ............ 438/104 |
| 2010/0230741 | A1 | 9/2010 | Choi et al. |
| 2010/0295113 | A1* | 11/2010 | Kang et al. ............ 257/316 |
| 2010/0301425 | A1* | 12/2010 | Kang et al. ............ 257/384 |
| 2011/0026327 | A1* | 2/2011 | Huang et al. ............ 365/185.17 |
| 2011/0057250 | A1 | 3/2011 | Higashi |
| 2011/0303967 | A1 | 12/2011 | Harari et al. |
| 2011/0309425 | A1 | 12/2011 | Purayath et al. |
| 2011/0309426 | A1 | 12/2011 | Purayath et al. |
| 2011/0309430 | A1 | 12/2011 | Purayath et al. |
| 2012/0049245 | A1 | 3/2012 | Bicksler et al. |
| 2012/0126303 | A1 | 5/2012 | Arai et al. |
| 2012/0126306 | A1 | 5/2012 | Kawaguchi et al. |
| 2012/0178235 | A1 | 7/2012 | Pachamuthu et al. |
| 2012/0276713 | A1 | 11/2012 | Miyahara et al. |

OTHER PUBLICATIONS

U.S. Appl. No. 13/712,788, filed Dec. 12, 2012.
Ragunathan, Shyam, et al., "Investigation of Ballistic Current in Scaled Floating-gate NAND FLASH and a Solution," IEEE International Electron Devices Meeting (IEDM), Dec. 2009, pp. 34.1.1-34.1.4.
Ragunathan, Shyam, et al., "Investigation of Ballistic Current in Scaled Floating-gate NAND FLASH and a Solution," Powerpoint Presentation, IEEE International Electron Devices Meeting (IEDM), Dec. 2009, pp. 1-38.

* cited by examiner

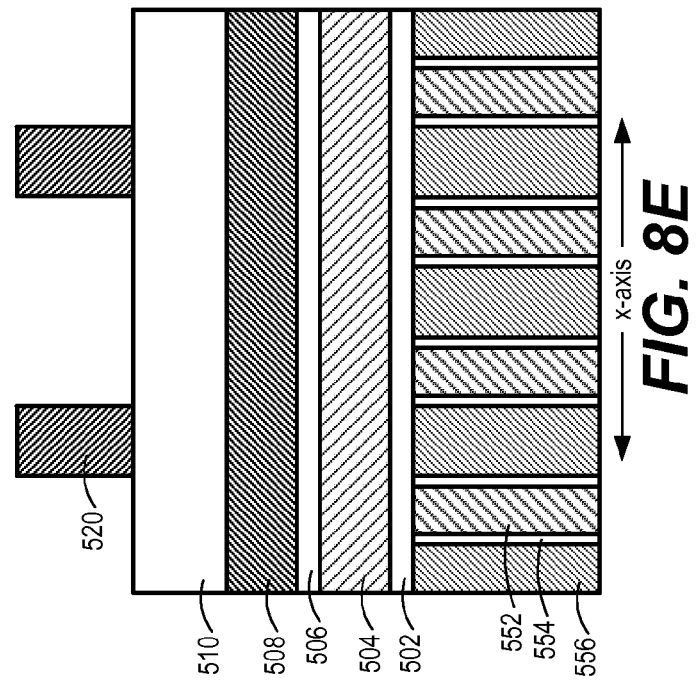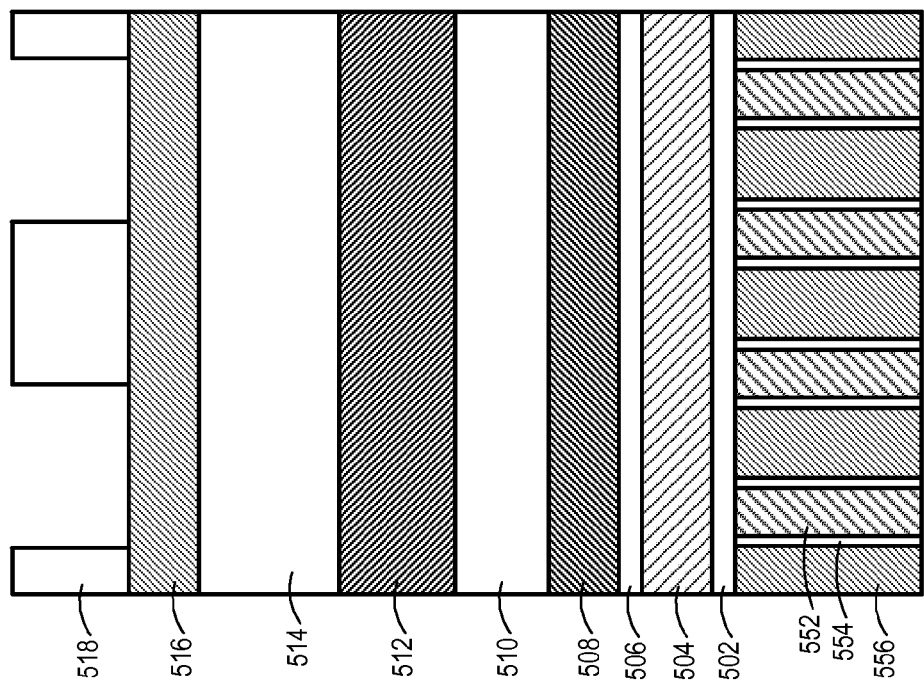

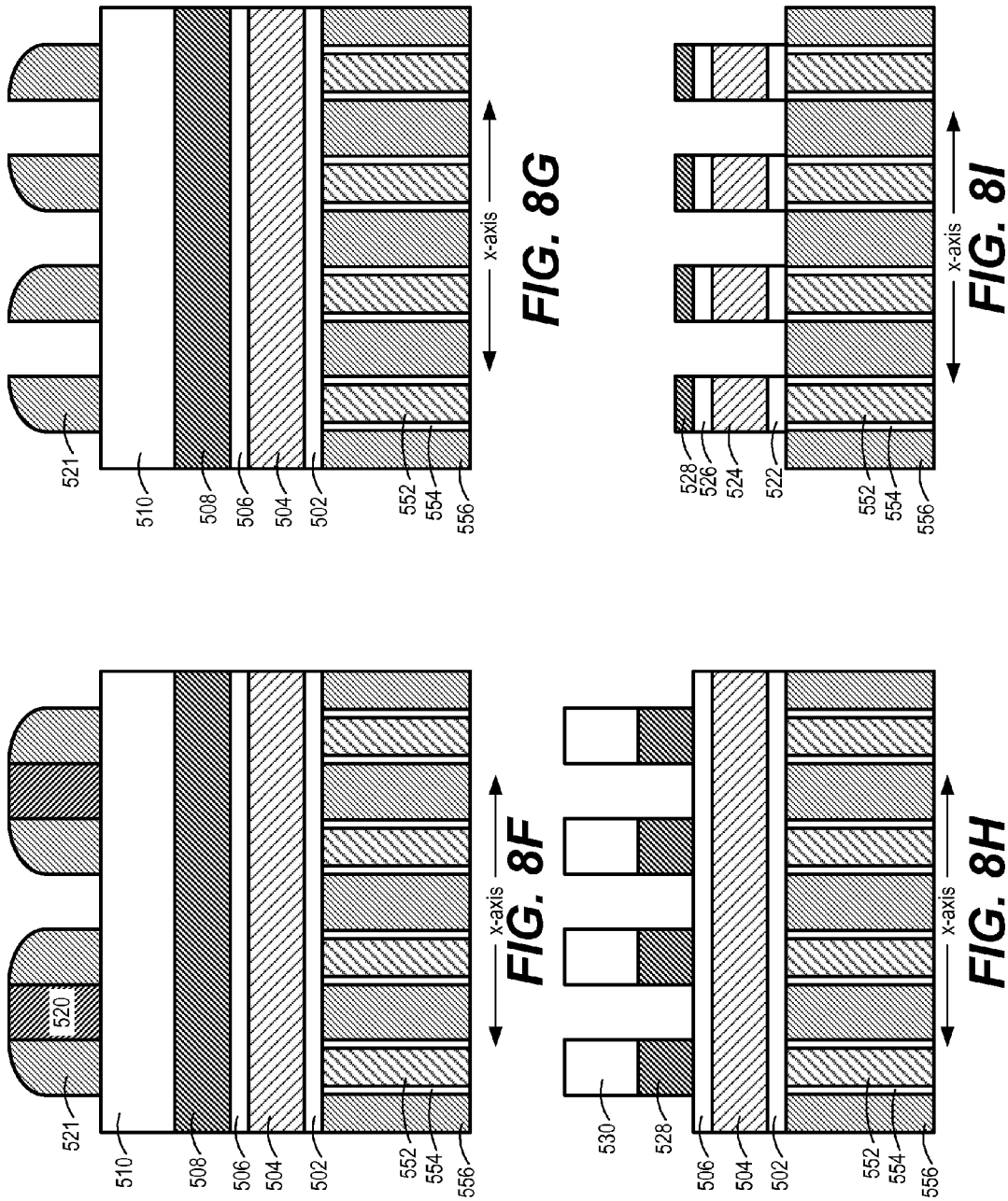

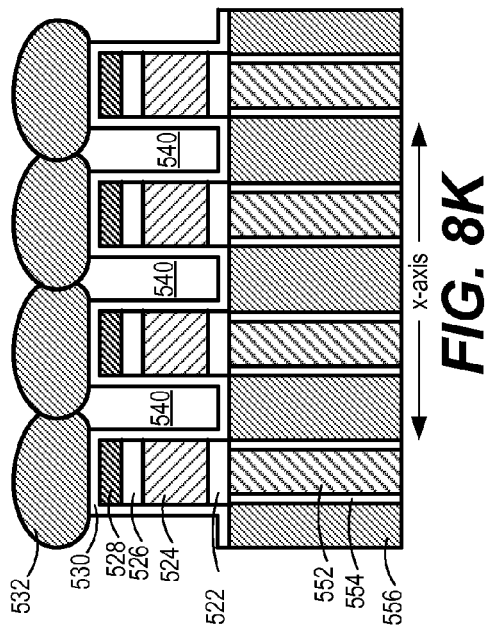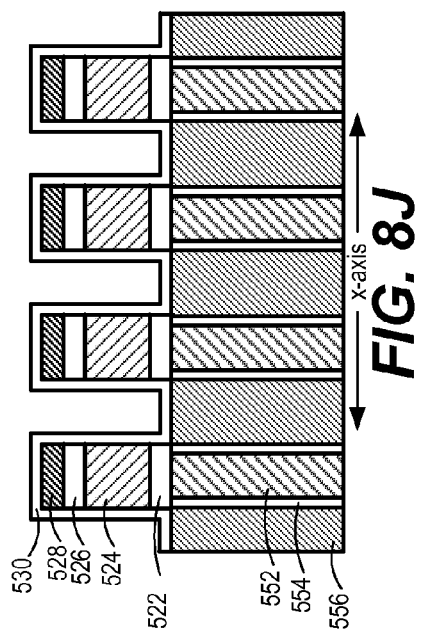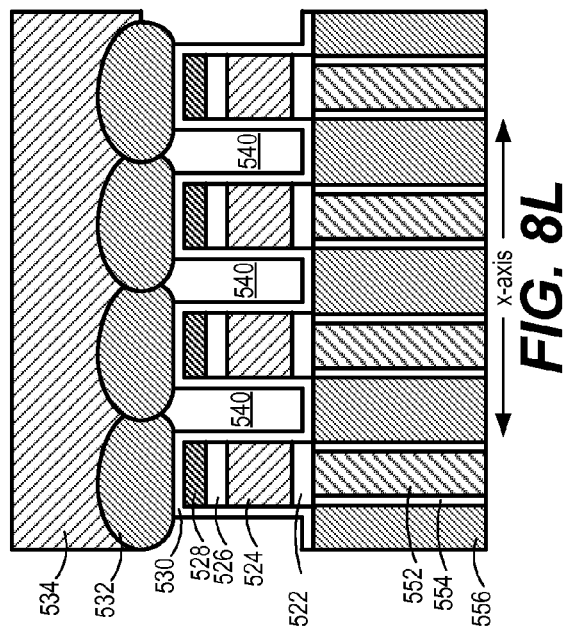

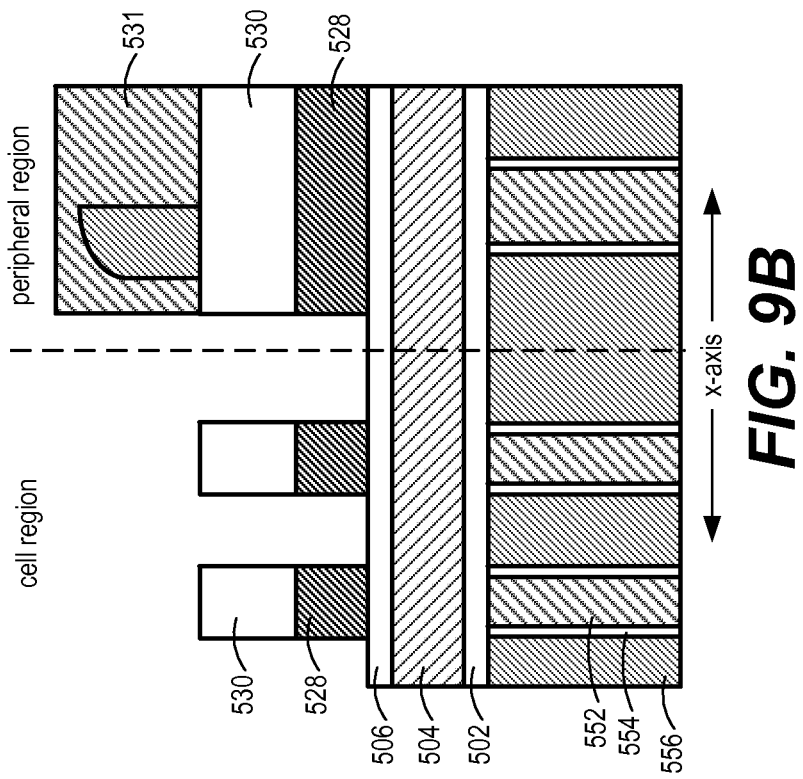
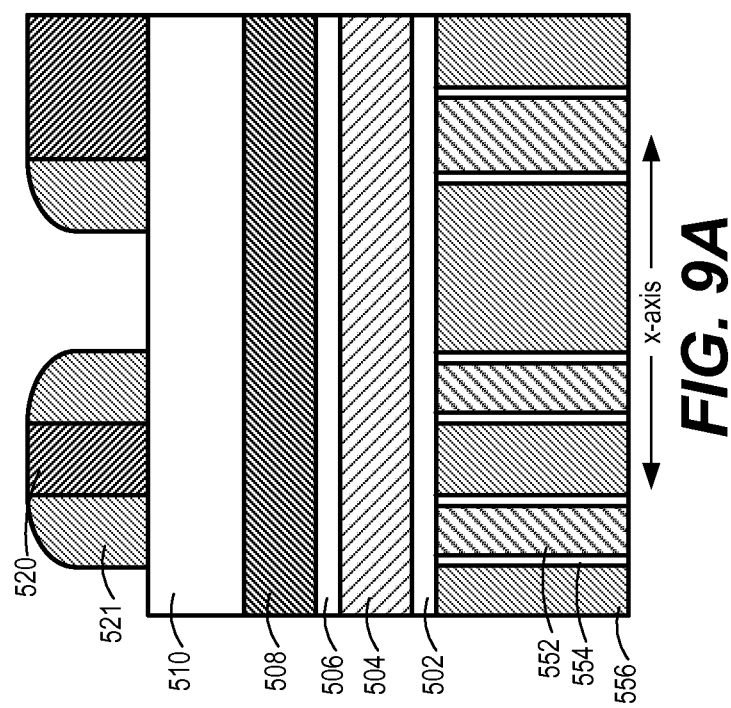

METAL LAYER AIR GAP FORMATION

PRIORITY CLAIM

The present application claims priority from U.S. Provisional Patent Application No. 61/599,923, entitled "Metal Layer Air Gap Formation" by Pachamuthu, et al., filed Feb. 16, 2012, incorporated by reference herein in its entirety.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes. Additionally, bit lines, source lines, vias and related circuitry continue to be scaled to smaller feature sizes. With smaller features, the demands on the materials from which they are formed continue to increase. In many instances, traditional processes and materials are unable to meet performance constraints at smaller feature sizes.

BRIEF DESCRIPTION OF THE DRAWINGS

FIGS. 8A-8L are cross-sectional views through a portion of a non-volatile memory array depicting a fabrication process according to the method of FIG. 7 in one embodiment.

FIGS. 9A-9F are cross-sectional views through a portion of a non-volatile memory array depicting a fabrication process according to the method of FIG. 7 in one embodiment.

DETAILED DESCRIPTION

Figure 1:
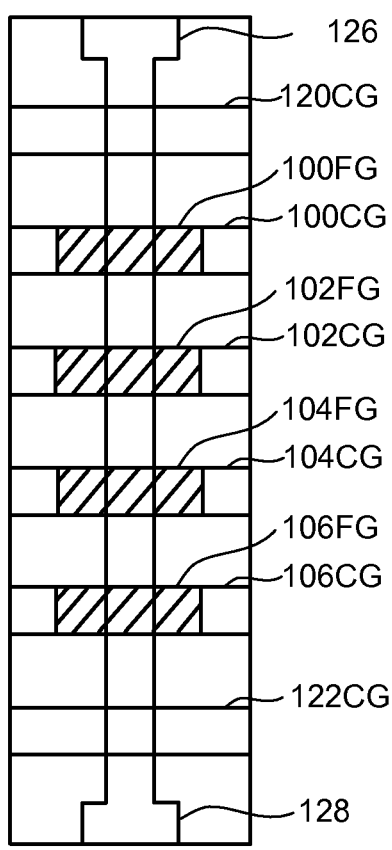
FIG. 1 is a top view of a NAND string.

Embodiments of the present disclosure are directed to high-density semiconductor memory, and more particularly to electrical isolation between discrete devices and components in non-volatile memory. Air gaps are introduced between adjacent bit lines to provide electrical isolation between the bit lines. Non-volatile memory arrays and related methods of fabrication are provided.

Air gaps are provided to reduce interference and resistance between metal bit lines in non-volatile memory structures. Metal vias can be formed in contact with the drain region of each NAND string in a non-volatile memory array. The metal vias extend vertically with respect to the substrate surface to provide contacts for bit lines that are elongated in a column direction above the NAND strings formed below. The metal vias can be separated by a dielectric fill material. Layer stack columns extend in a column direction over the dielectric fill and metal vias. Each layer stack column includes a metal bit line over a nucleation line. Each metal via contacts one of the layer stack columns at its nucleation line. A low temperature dielectric liner extends along sidewalls of the layer stack columns. A non-conformal dielectric overlies the layer stack columns defining a plurality of air gaps between the layer stack columns.

The air gaps are elongated in the column direction between adjacent bit lines. The air gaps may extend in a row direction between a protective sidewall film formed on sidewalls of the layer stack columns. Vertically, relative to the substrate surface, the air gaps may extend from a lower surface of the non-conformal dielectric layer at an upper endpoint to an upper surface of the protective sidewall film overlying the dielectric fill material. Various dimensions may be used.

The nucleation line forms a contact region for the underlying metal via and overlying metal bit line. For example, a tungsten nitride nucleation line is formed between a copper via and tungsten metal bit line in one embodiment. The nucleation line avoids void formation and so-called peel-off at the metal bit line and via interface.

In one embodiment, the layer stack columns include one or more cap layers overlying the metal bit lines. The cap layers extend the vertical thickness or height of the layer stack column relative to the substrate surface. This increase in thickness increases the aspect ratio of the columns. The non-conformal dielectric film may thus be formed at a greater distance from the protective film or dielectric fill. This increases the upper endpoint of the air gaps, thereby increasing the aspect ratio of the air gap. The increased aspect ratio increases the insulator capacity of the air gaps to reduce interference between the metal bit lines. This reduction in interference improves the RC time delay of the metal bit lines. A barrier metal layer is used in between the cap layer(s) and metal bit line layer. The barrier metal layer inhibits an interface layer between the cap layer and the metal bit line that could increase interface resistance between the two layers and thus, increases in metal bit line resistance. The barrier metal layer further increases the aspect ratio of the layer stack columns and thus, the size and aspect ratio of the air gaps.

Figure 2:
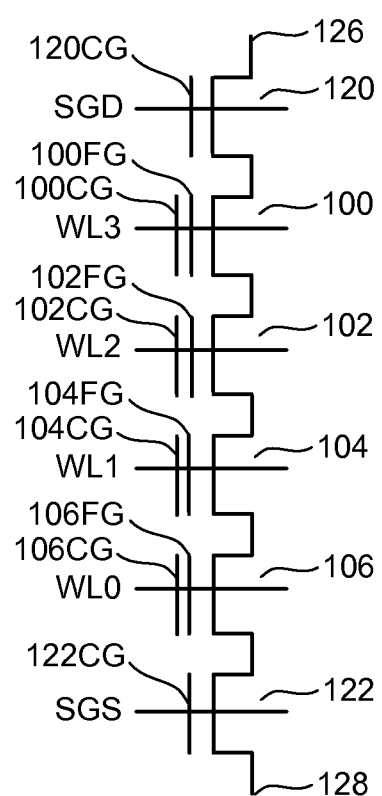
FIG. 2 is an equivalent circuit diagram of the NAND string depicted in FIG. 1.
Figure 3:
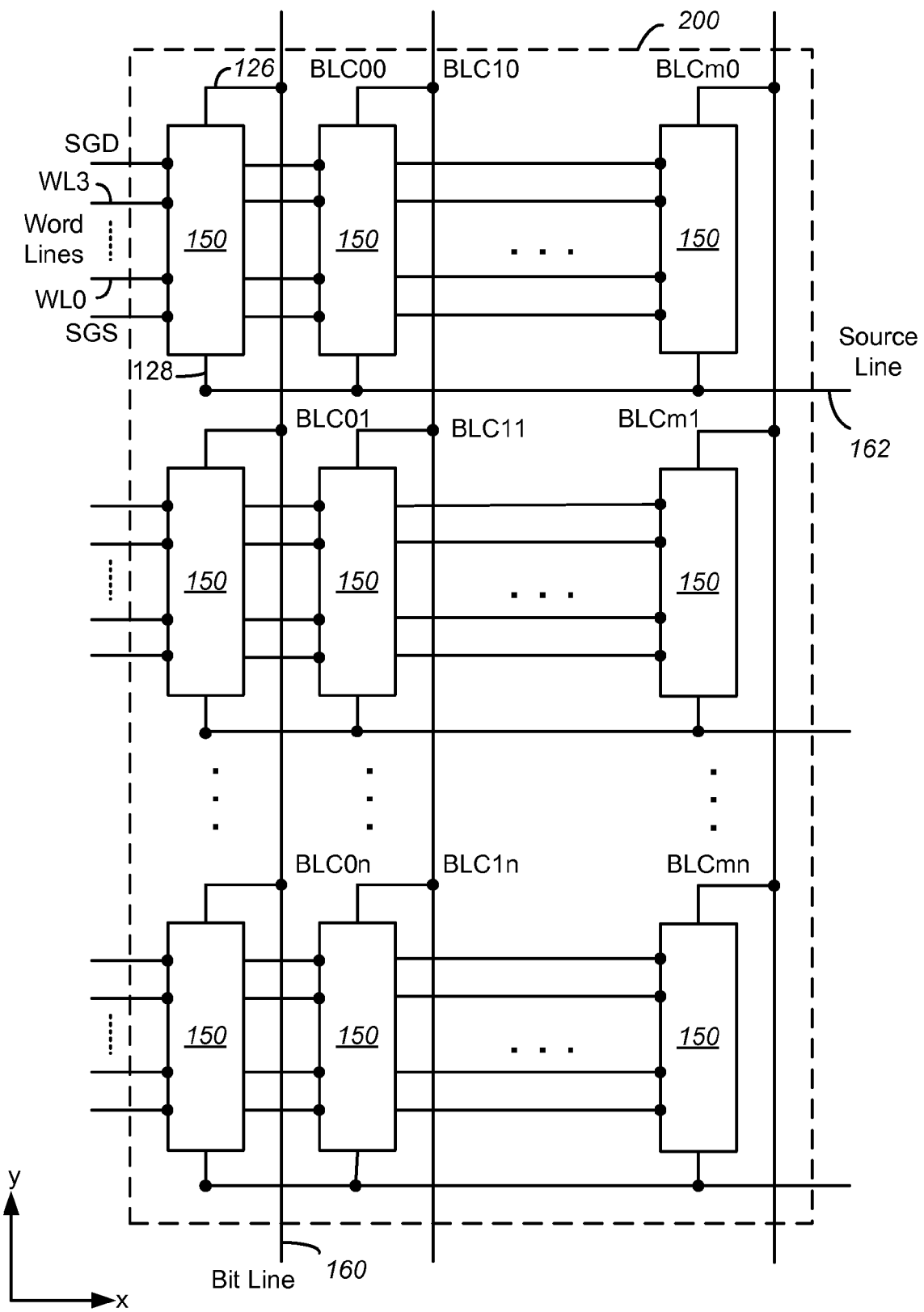
FIG. 3 is a plan view of a portion of a NAND flash memory array.

A portion of a NAND memory array as can be fabricated in accordance with embodiments of the present disclosure is shown in plan view in FIG. 3. Along each column, a bit line 160 is coupled to the drain regions 126 of select gates (e.g., 120 in FIG. 2). BLC0-BLmn, represent bit line connections such as by vias or contacts to global vertical metal bit lines 160. An example with four floating gate memory cells included in each NAND string 150 and connected to word lines WL0-WL3 is depicted by way of example. Typically, the individual strings include 16, 32 or more memory cells, forming a column of memory cells. The column direction or direction in which the bit lines are elongated is depicted as the y-direction in FIG. 3.

Control gate (word) lines labeled WL0-WL3 extend across multiple strings over rows of floating gates. Along each row, a source line 162 may be coupled to the source regions 128 of select gates (e.g, 122 in FIG. 2). The row direction or direction in which the word lines extend is depicted as the x-direction in FIG. 3. Examples of a NAND architecture array and its operation as part of a memory system may be found in U.S. Pat. No. 5,570,315, U.S. Pat. No. 5,774,397, and U.S. Pat. No. 6,046,935.

Figure 4:
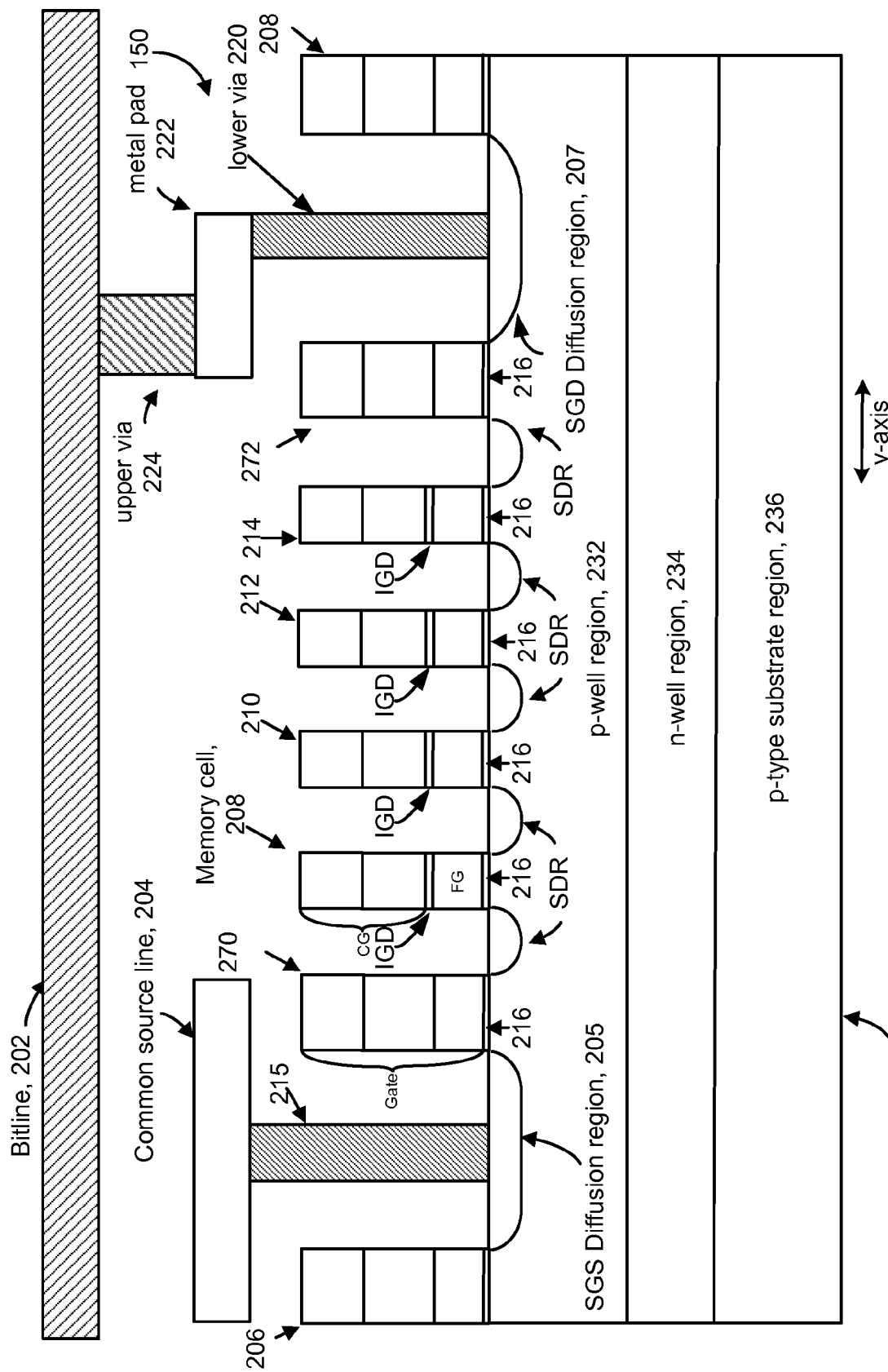
FIG. 4 is a cross-sectional view of a NAND string that can be included in the NAND flash memory array.

FIG. 4 is a cross-sectional view taken in the y-direction depicting a NAND string that can be fabricated in accordance an embodiment of the disclosure. NAND string 150 includes a source-side select gate transistor 270, a drain-side select gate transistor 272, and four storage elements 208, 210, 212, 214, formed over substrate 240. Gate 270 is controlled by a source selection line (not shown) and gate 272 is controlled by a drain selection line (not shown). Typically, there are more than four storage elements in a NAND string. Also depicted are a source-side select gate 206 for an adjacent NAND string (not depicted) on the source side of the depicted NAND string and a drain-side select gate 208 for an adjacent NAND string (not depicted) on a drain side of the depicted NAND string. SGD diffusion region 207 is formed at the drain side of the NAND string and is shared between the drain-side select gate 272 of the depicted NAND string 150 and the drain-side select gate 208 associated with the NAND string adjacent on the drain side. A bit line 160 above the NAND string 150 (and other NAND strings not depicted) is connected to the SGD diffusion region 207 by a bit line connection. In FIG. 4, the bit line connection includes an upper portion, middle portion and lower portion. The lower portion in FIG. 4 includes a lower via 220, also referred to as a contact in contact with the SGD diffusion region 207. In one SGD diffusion region 207 there is one bit line connection. The lower via can be formed of one or more metals, polysilicon (doped) or combinations of these materials. Tungsten, copper or other metals can be used. The lower via 220 contacts a metal pad 222 which contacts an upper via 224. The metal pad is tungsten or copper but other materials can be used. The upper via 224 contacts the metal pad 222 and bit line 160. In one example, the metal pads 222 are formed in a first metal layer (e.g., metal 0), the upper vias 224 are formed in a second metal layer (e.g., metal 1), and the bit lines are formed in a third metal layer (e.g., metal 2). The lower vias 220 can be formed in a non-metal layer in one example prior to the first metal layer or using an additional metal layer before the first metal layer. Note that other types of bit line connections may be used in accordance with the present disclosure. For more information on bit line connections, see U.S. Pat. No. 8,325, 529, entitled "Bit-Line Connections for Non-Volatile Storage." The common source line 204 is connected to the SGS diffusion region 205 by the source line via or contact 215. The source line via is formed from the same metal layer as the lower via 220 in one example and the source line 204 is formed from the same metal layer at the metal pad 222.

In one example, the substrate 240 employs a triple-well technology which includes a p-well region 232 within an n-well region 234, which in turn is within a p-type substrate region 236. The NAND string and its non-volatile storage elements can be formed, at least in part, on the p-well region. A number of memory cell source/drain regions (SDR) are provided on either side of each storage element. A gate or tunnel dielectric layer 216 is formed between the substrate 240 and the floating gate of each memory cell, as well as between the substrate 240 and each select gate transistor 270, 272. A memory cell may include a floating gate (FG) and a control gate (CG) with an intermediate dielectric (also referred to as an inter-gate dielectric (IGD)) therebetween. Note that the control gate or word line may be shared with many other memory cells on different NAND strings.

The tunnel dielectric layer is a thin layer of oxide (e.g., $SiO_2$) grown in one embodiment, although different materials and processes can be used. Chemical vapor deposition (CVD) processes, metal organic CVD processes, physical vapor deposition (PVD) processes, atomic layer deposition (ALD) processes, thermal oxidation or other suitable techniques can be used to form the tunnel dielectric layer. Unless otherwise noted, these processes generally can be used to form the various materials described herein. Although not shown, one or more high voltage gate dielectric regions may be formed at a peripheral circuitry region before or after forming the tunnel dielectric layer. The high voltage gate dielectric regions may be formed with a larger thickness than the tunnel dielectric layer.

The floating gate layer is a polysilicon floating gate layer in one embodiment. The vertical dimension (with respect to the substrate surface) or thickness of the charge storage layer can vary by embodiment. Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, the metal floating gate layer is a high work function metal. In one example, the metal is ruthenium. Other metals such as titanium, tungsten, tantalum, nickel, cobalt, etc., and their alloys (e.g., TiN, WN, TaN, NiSi, CoSi, WSix) can be used.

The intermediate dielectric layer is a triple layer of oxide, nitride and oxide (ONO) in one embodiment. In one embodiment, a high-K (dielectric constant) material is used for the intermediate dielectric to reduce or eliminate charge transfer through the intermediate layer while providing enhanced control gate to floating gate coupling. Conformal deposition processes are used in one embodiment to form the intermediate dielectric layer along the vertical sidewalls of the charge storage layer while leaving spaces or openings therebetween that will be filled with the control gate material. High dielectric constant (K) materials are used in one embodiment. High K materials can enhance coupling between the control gates and floating gates. A self-aligned high-K approach is utilized in one embodiment to reduce or eliminate charge transfer through the intermediate dielectric material.

The control gate layer may be formed of one or more layers of polysilicon and/or metals. The polysilicon can be doped in-situ or after formation. In another embodiment, the control gate layer is formed at least partially of a metal. In one example, the control gate layer has a lower portion that is formed from polysilicon and an upper portion that is formed from metal. A barrier layer may be formed between the polysilicon and the metal, to prevent silicidation. In one embodiment, the control gate is entirely metal. Metals in various embodiments may include tungsten, although other metals may be used. The control gate layer may be formed by chemical vapor deposition (CVD), atomic layer deposition (ALD), plating, or another technique.

The control gate lines are typically formed over the floating gates as a self-aligned stack, and are capacitively coupled to the floating gates through the intermediate dielectric layer IGD. The floating gate material can be shorted to the control gate for the select transistors to be used as the active gate. In FIG. 4, no intermediate dielectric layer is depicted at the select gates. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774, 397 and 6,046,935.

Scaling of non-volatile storage elements continues to reach smaller and smaller dimensions to meet increased demands for capacity and size. For example, storage elements are often formed at half-pitch to increase stand-alone flash storage capacity. Half-pitch refers to fabrication that forms features at half of the line and space size defined by the lithographic process being used. Spacer-assisted patterning and other techniques may be used to define feature sizes at half-pitch This aggressive scaling leads to increases in parasitic capacitance due to capacitive coupling between metal interconnection lines. As scaling increases, a number of parameters can approach physical limits. Metal bit line (BL) resistance capacitance (RC) time delay may increase, for example, because of high capacitance interference and interface resistance between metal bit-lines due to high dielectric medium layers (e.g., TEOS, SiN etc.). Cell current drop may also increase with increases in BL resistance. As a result, reliability and performance of the memory cells can be inadvertently affected.

Figure 5:
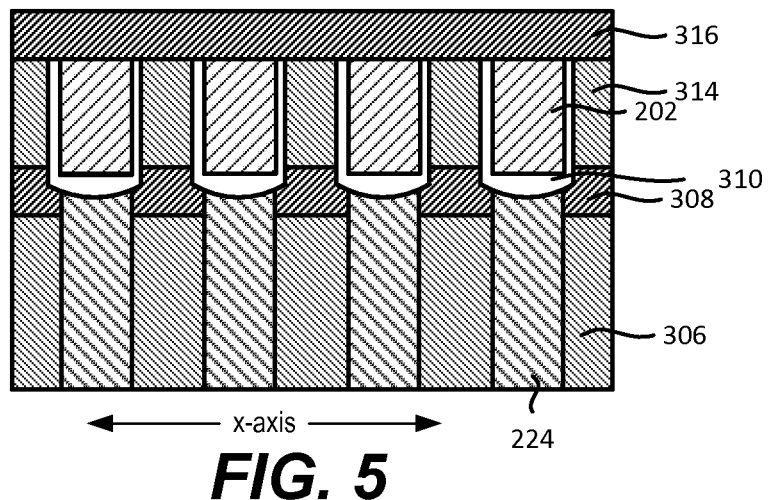
FIG. 5 is a cross-section view depicting a traditional technique for isolating bit lines.

Low-K dielectrics may be used to reduce bit-line capacitance interference in some instances. These materials, however, may not withstand high electric field stress and thus, early breakdown and bit-line opens can occur. FIG. 5 depicts a traditional metal layer isolation technique. Upper metal bit line connections or vias 224 are formed as shown in FIG. 4. Each via is coupled to a metal pad and lower via (not shown) which contacts a diffusion region for a single NAND string of the array to provide a connection point to one of the overlying bit lines. In this example, each via includes a barrier metal layer 304. The vias are separated by a low-K dielectric material 306 to provide electrical isolation therebetween. A high dielectric constant stopper material 308 such as silicon nitride (SiN) is formed at the intersection of the metal vias 224 and the overlying metal bit lines 202. A resistive contact liner 310 is formed in trenches before filling with the material for the bit lines. The resistive contact liner occupies some volume of the trenches. This leads to high contact resistance and poor distribution. The metal bit lines are electrically isolated by a low dielectric constant material 314 such as dTEOS or HDP. Another high dielectric constant stopper material 316, e.g., SiN, is formed over the dielectric fill material. While dielectric fill materials may be suitable for isolation in devices with larger feature sizes, these traditional materials show susceptibility to interference and increased resistance as devices continue to be scaled. Volume is often occupied by a resistance contact liner at the bottom of the metal bit line as well, leading to high contact resistance and poor distribution.

Figure 6:
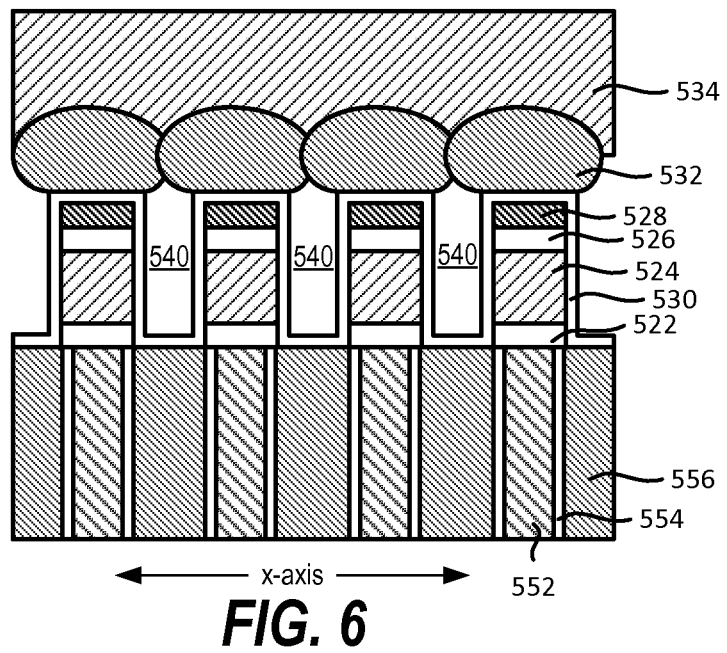
FIG. 6 is a cross-sectional view depicting air gap isolation for bit lines in accordance with one embodiment.

FIG. 6 is a cross-sectional view depicting a metal bit line structure in accordance with one embodiment including air gap isolation structures for the metal bit lines. Metal vias 552 are formed in a dielectric fill material 556 and extend vertically with respect to the substrate surface (not shown). In one example, metal vias 552 correspond to upper vias 224 in FIG. 4 having a lower endpoint coupled to a metal pad and an upper endpoint coupled to a metal bit line. In another example, metal vias 552 correspond to lower vias 222 in FIG. 4 having a lower endpoint coupled to an underlying drain diffusion region of a NAND string, for example and an upper endpoint coupled to a metal pad. In other example, metal vias 552 may represent a via that couples directly from a diffusion region to a bit line. The vias in this example include barrier metal liners 554. Each metal via 552 connects to a metal stack column. The metal stack column includes a nucleation strip 522 that contacts the underlying via, a metal bit line 524 over the nucleation strip 522, a barrier metal strip 525 and a cap strip 528. The metal bit lines are tungsten in one embodiment, but other materials can be used. The nucleation strips provide a stable contact between the metal lines and the metal vias. In various embodiments, the nucleation strips may inhibit the formation of voids or peel-off at the interface of these materials.

A protective sidewall liner 530 is formed along the sidewalls of the layer stack columns. The liner may also be formed over exposed portions of the dielectric fill material 556. The liner inhibits oxidation and thus, high resistivity of the metal lines.

A non-conformal cap layer is formed over the layer stack columns. The cap layer accumulates unevenly on horizontal surfaces such that it joins over the spaces between adjacent layer stack columns without filling the spaces. The cap layer seals these spaces forming air gaps 540 between the layer stack columns. In one embodiment, the cap layer is a silane (SiH4). The air gaps have a lower endpoint that is defined by an upper surface of the protective sidewall liner 530 if present or the exposed dielectric fill material 306. The air gaps have an upper endpoint that is defined by the lower surface of the non-conformal film. The presence of cap strips 528, and additionally the barrier metal strips 526 in the layer stack columns increases the aspect ratio of the air gaps to enhance isolation in the memory array structure. The ratio of the height (vertical with respect to the substrate surface) of each air gap to its width in the x-direction is increased. In this manner, the air gap provides additional electrical isolation to decrease interference and capacitance between adjacent metal lines. This increased aspect ratio enables scaling at half-pitch lithography sizes and reduction in interference between metal lines. This in turn improves resistance capacitance (RC) delay along the metal lines. Additionally, the low-K dielectric break down issues due to high electric field stress can be avoided, as well as metal pinch off or step coverage issues in the trench along with avoiding metal void issues. Controlled thickness scaling can be provided in one example, leading to a wide range of process margin.

Air gaps can include various material compositions and need not correspond to atmospheric air. For example, concentrations of elemental gases may vary in the air gap regions. An air gap is simply a void where no solid material is formed in the semiconductor structure. Although referred to as "air" gaps, the elemental composition of the air can include many different materials. Thus, the term "air" should not be construed as having any particular elemental composition. Any number and type of gases may be in the gaps.

Figure 7:
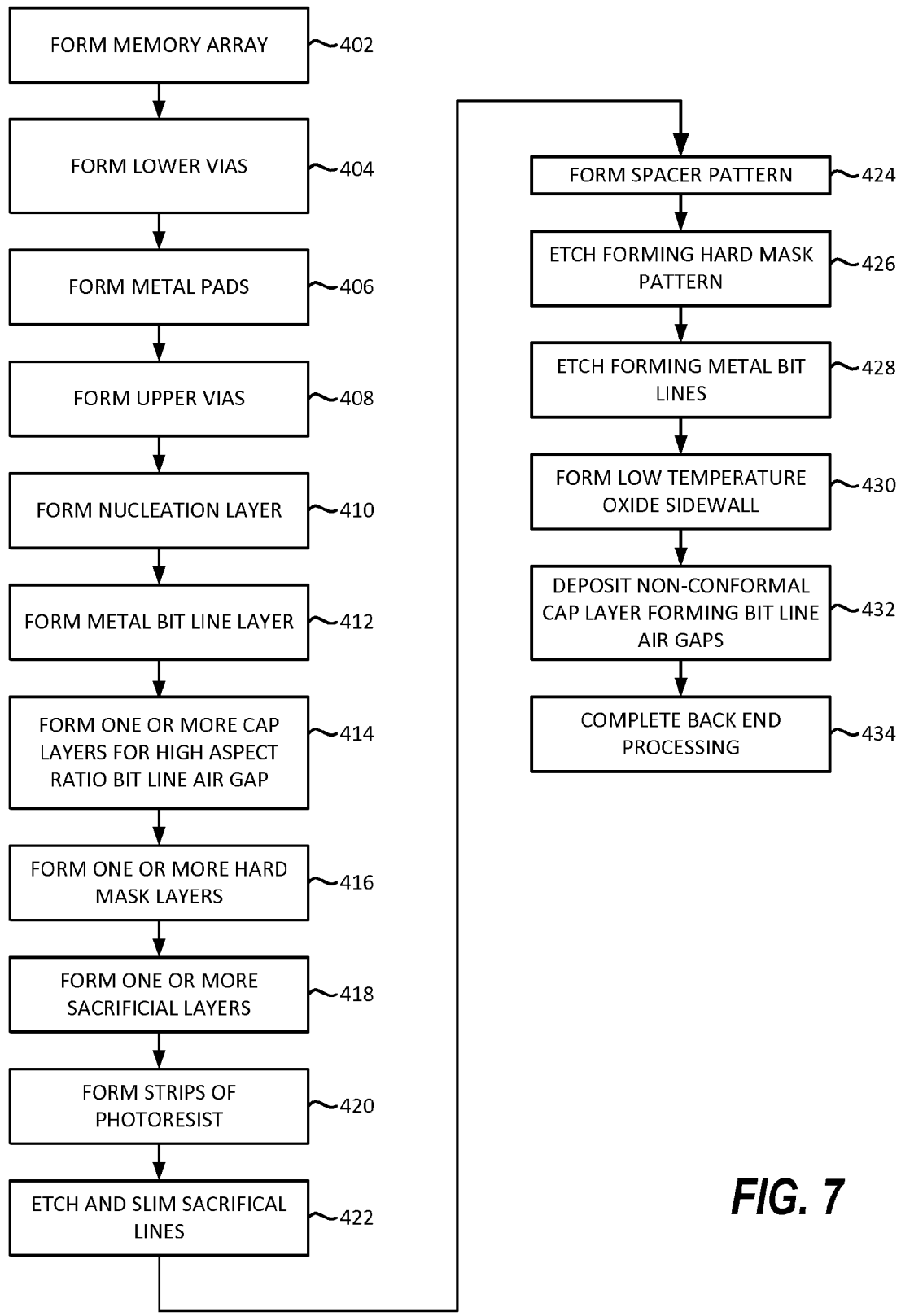
FIG. 7 is a flowchart describing a method of fabricating non-volatile storage with bit line air gap isolation in accordance with one embodiment.

FIG. 7 is a flowchart describing a method of fabricating non-volatile storage having metal bit lines and air gap isolation regions between the metal bit lines in accordance with one embodiment. At step 402, a memory array structure is fabricated over a substrate. Step 402 can include using a p-type substrate and forming within the p-type substrate, an n-type well, and within the n-type well a p-type well as illustrated in FIG. 4. Memory layer stack columns including strips of charge storage material separated from the substrate by a gate dielectric material can be formed in one example, along with active areas in the substrate separated by shallow trench isolation regions. Rows of non-volatile storage elements can then be formed by orthogonally etching the memory layer stack columns. Although principally with respect to NAND type non-volatile memory arrays, the process is not so limited. For a further description of non-volatile memory array fabrication as can be utilized at step 402, see U.S. application Ser. No. 13/348,619 entitled "Air Isolation in High Density Non-Volatile Memory," by Pachamuthu et al., filed Jan. 11, 2012 and incorporated by reference herein in its entirety.

Figure 8A:
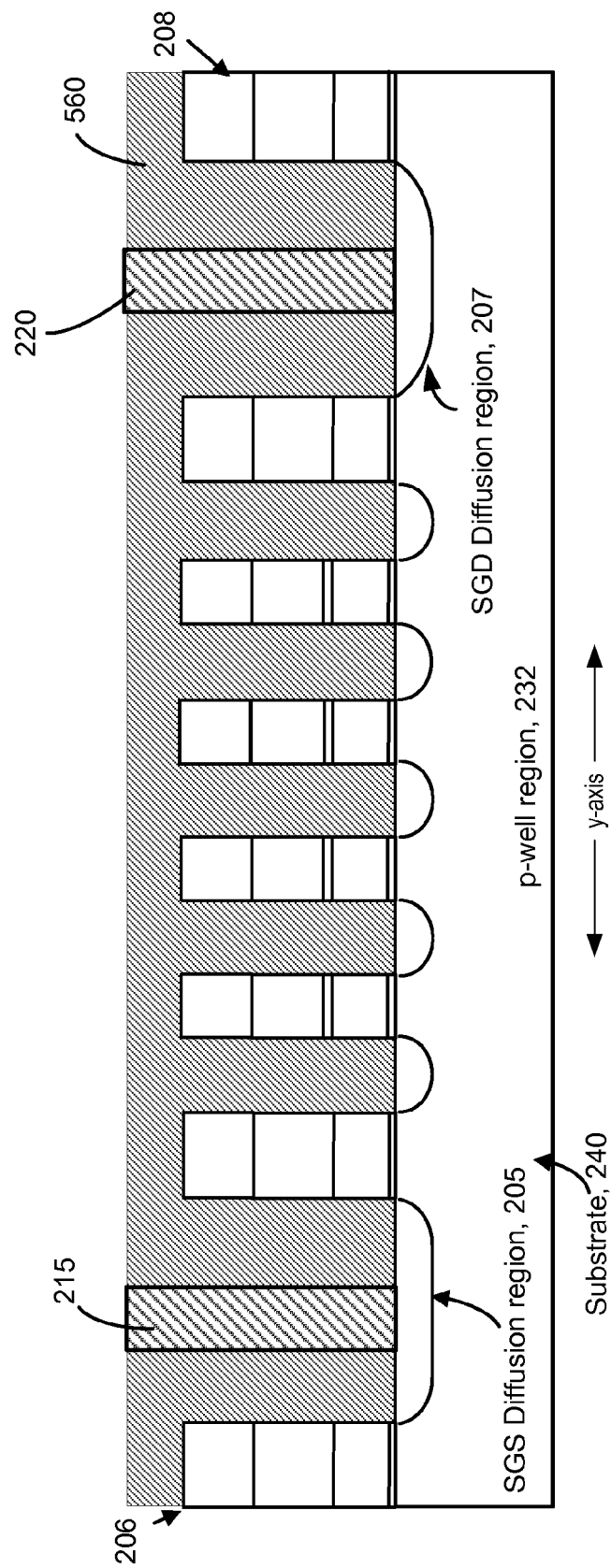

At step 404, lower vias are formed in contact with the source and drain diffusion regions. FIG. 8A is a cross-sectional view of a non-volatile memory array depicting the results of step 402-404 in one example. FIG. 8A depicts a single NAND string in the bit line direction along the x-axis as can be incorporated in a larger memory as earlier described. A dielectric fill material 560 for first metal layer processing can be formed over the memory array structure. The dielectric fill material provides isolation between any exposed components of the memory array for subsequent processing. The dielectric fill material may cover the memory array including previously formed non-volatile storage elements, select gates, and peripheral circuitry. Any number of materials such as an oxide or nitride can be used for the various dielectric fill materials described. Openings in the dielectric fill material are formed to the drain regions, at drain and source diffusion regions for example, for individual strings of the memory array. Openings to other components such as the gates of peripheral gates, etc. may be created as well. Traditional photolithography or spacer-assisted patterning can be used to form the passages. The openings are then filled with a metal such as Copper or Tungsten or other material such as doped polysilicon or a combination of these materials. Planarization such as chemical mechanical polishing (CMP) can be used to remove excess material to expose the dielectric fill material and create electrically isolated vias. In this example, lower metal bit line vias 220 and source lines vias 215 are formed.

Figure 8B:
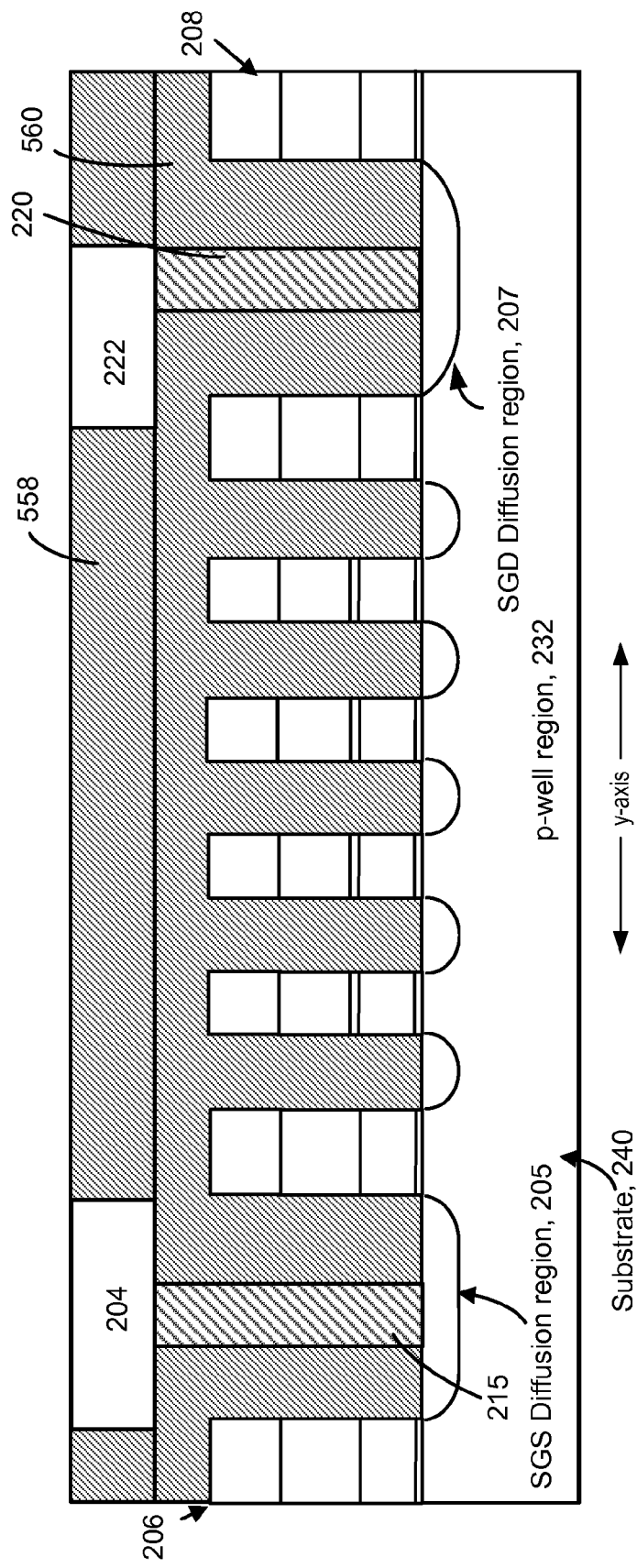

At step 406, metal pads are formed for the lower bit line vias. FIG. 8B depicts the results of step 406 in one embodiment. Another dielectric region 558 is formed in order to provide a region in which to form metal pads 222. For example, a material such as silicon dioxide is deposited. Patterning and etching is performed to form trenches for the metal pads 222. Patterning and etching may involve depositing a layer of photoresist. Then, the photoresist may be patterned by an exposure and development process. Specifically, a pattern may be formed on the photoresist by exposing the photoresist to light through a mask (or reticle) using a photo lithography tool. Then, a portion of the photoresist is removed leaving the pattern. Note that the metal pads 222 may be formed using a single exposure technique. In this example, trenches are formed for source lines 204 as well. The trenches are filled to form the metal pads 222 and source lines 204. An example material for filling the trenches is tungsten. However, the trenches could be filled with another metal, doped polysilicon, or a combination of materials. Planarization can be used to remove excess material to expose the dielectric fill material and create electrically isolated metal pads.

Figure 8C:
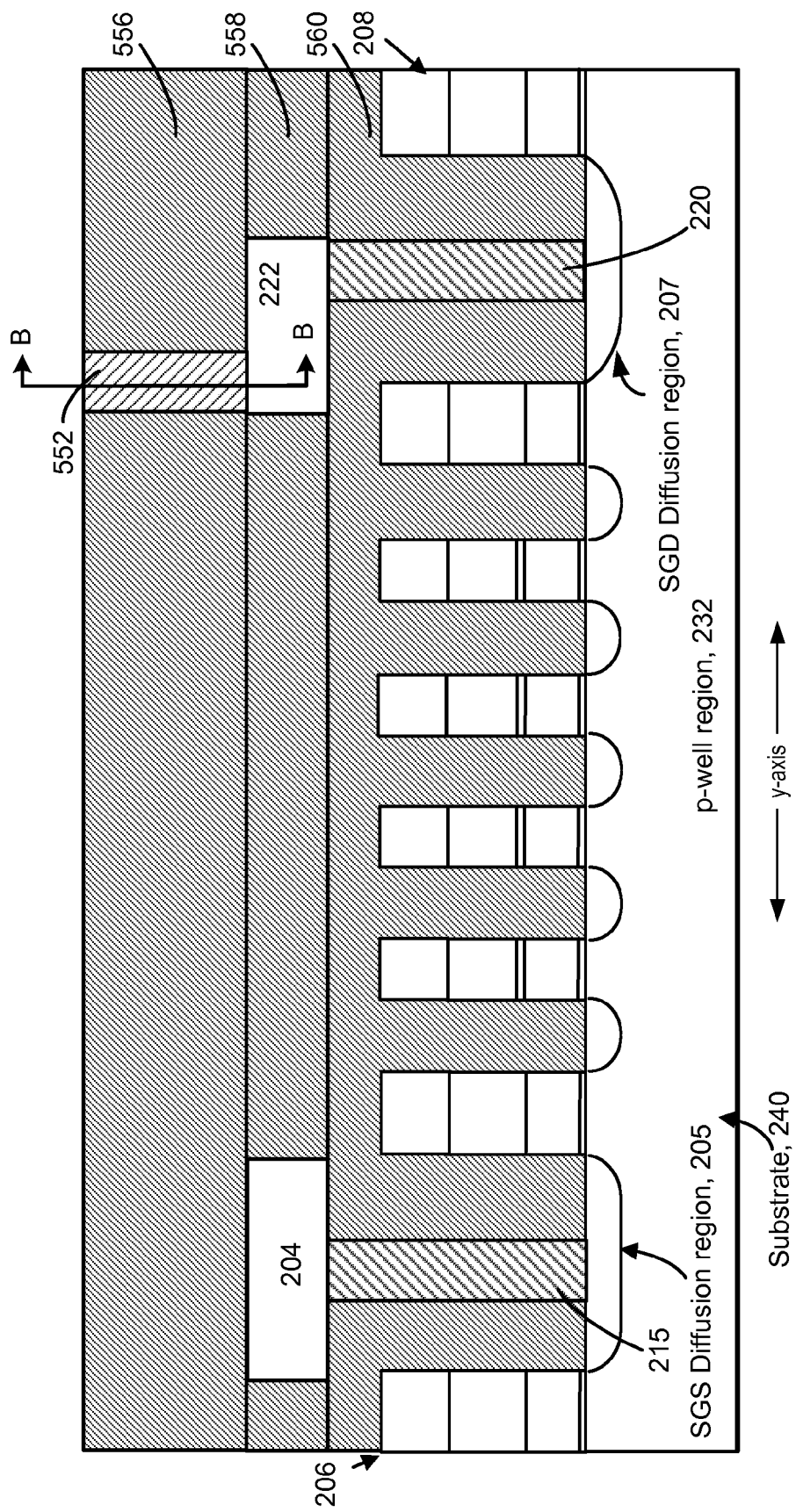

At step 408, upper metal vias are formed for contacting the metal pads 222. FIG. 8C depicts the results of step 408 in one embodiment. A third dielectric region 556 is formed such that upper vias 552 may be formed. For example, a material such as silicon dioxide may be deposited. Patterning and etching is performed to form holes for the upper vias. Patterning and etching may involve depositing a layer of photoresist. Then, the photoresist may be patterned by an exposure and development process. Specifically, a pattern may be formed on the photoresist by exposing the photoresist to light through a mask (or reticle) using a photo lithography tool. Then, a portion of the photoresist is removed leaving the pattern. Note that the upper vias 552 may be formed using a single exposure technique. The holes are filled to form the upper vias 552. An example material for filling the holes is tungsten. However, the holes could be filled with another metal, doped polysilicon, or a combination of materials.

After forming the upper vias, a nucleation layer is formed over the substrate at step 410. In one example where the bit line metal layer uses tungsten, the nucleation layer may be or include tungsten nitride. The tungsten nitride inhibits the formation of voids and/or so-called peel-off or disconnection between the upper via metal and the bit line metal. FIG. 8D is a cross-sectional view taken along line A-A of FIG. 8C depicting the formation of a nucleation layer 502 over the exposed upper surface of the upper vias 552 and fill material 556. The lower layers are not shown for simplicity. In this example, a barrier metal liner 554 such as titanium nitride or tantalum nitride is formed for the upper vias.

At step 412, a metal bit line layer is formed over the nucleation layer. Various metals such as tungsten and copper may be used to form the metal bit lines. These material exhibit low resistance and are suited to continuous scaling of feature sizes. Tungsten formed using plasma vapor deposition can be used to further reduce the resistivity of the bit lines. At step 414, one or more cap layers are formed to facilitate the formation of a high aspect ratio bit line air gap. FIG. 8D depicts the formation of a tungsten metal layer 504 and a barrier metal layer 506 prior to forming a cap layer 508. In one example, the barrier metal layer is titanium nitride or tantalum nitride and the cap layer is silicon nitride. Other materials can be used. By providing an additional cap layer 508, the aspect ratio of the later formed layer stack columns is increased to provide larger vertical air gap dimension.

At step 416, one or more hard mask layers such as silicon (e.g., amorphous silicon aSi) or SiN are formed, followed by one or more sacrificial layers at step 418. FIG. 8D depicts the formation of a sacrificial layer 512 (e.g., TEOS, other oxide or nitride), anti-reflective coating 514, and spin-on glass (SOG) layer 516. At step 420, strips 518 of photoresist are then patterned over the SOG layer using standard photolithography having a defined line (L) and space (S) size.

At step 422, the sacrificial layer is etched according to the pattern and slimmed to form sacrificial strips that extend in the direction of the bit lines. FIG. 8E depicts the results of reactive ion etching using the photoresist as a mask to form strips 520 of the sacrificial layer 512. In FIG. 8E, the strips have been slimmed to form a feature size or dimension in the x-direction that is less than the minimally definable feature size of the photolithography.

At step 424, a spacer pattern is formed using the sacrificial strips 520. FIGS. 8E-8F depicts the results of step 422 in one embodiment. Spacers 521 are formed along the vertical sidewalls of the sacrificial strips 520. Although illustrated with a dimension equal to that of the sacrificial strips 520, the spacers can be formed with a dimension less than that of the sacrificial strips to further reduce the feature size below that of the photolithography used in forming photoresist strips 518. For example, the spacers 521 may be formed with a dimension equal to half of that of the photolithography step to provide a half-pitch pattern for subsequent etching. In one example, the spacers are formed by depositing a conformal nitride over the sacrificial strips 520 and exposed portions of cap layer 510. The conformal nitride is then etched back to expose the underlying cap layer 510 and upper surface of sacrificial strips, thus forming spacers 521. In another example, the sacrificial strips 520 may be nitride and the spacers 521 may be oxide.

After forming the spacers, the sacrificial strips 520 are removed, leaving a pattern formed by spacers 521 as shown in FIG. 8E. A wet etch is used in one example to remove sacrificial oxide strips. The spacer dimension in the x-direction defines a pattern line size for subsequent processing.

At step 426, the spacers are used for etching the hard mask layer into a pattern. FIG. 8G depicts the results of step 424 in one embodiment. Various etch chemistries can be used. In one example, a wet etch is used. Etching may consume the spacer pattern, resulting in the structure shown in FIG. 8G. By using the hard mask layer and associated processing, a pattern including hard mask strips 530 extending in the column direction are formed. In this example, the wet etch chemistry also etches the cap layer 508 into strips 528. Although not illustrated, etching may also etch a portion of the barrier metal layer.

At step 428, the hard mask pattern from step 424 is used in a second etch process to etch the barrier metal layer, the metal bit line layer and the nucleation layer. FIG. 8H depicts the results of step 426 in one embodiment. Etching forms layer stack columns extending in the bit line direction. Each layer stack column includes a cap strip 528, barrier metal strip 526, metal bit line 524, and nucleation strip 522. The layer stack columns are each aligned, in the x-direction, at least partially over a row of bit line vias 220. It is noted that steps 426 and 428 are distinct etch processes in one embodiment. For example, a wet etch may be applied to etch the hard mask layer. With the hard mask layer formed, a dry reactive ion etch chemistry can be used to selectively etch the desired layers. In this manner, contamination or other harm to the metal bit line material is avoided, as might occur were a process requiring a wet etch of the metal bit line material.

At step 430, a low temperature dielectric liner is formed over exposed sidewalls of the layer stack columns. In one example, the low temperature dielectric is an oxide but nitrides or other materials may be used. FIG. 8I depicts the results of forming a low temperature dielectric liner 530. The liner 530 extends in the bit line direction along the sidewalls of the metal bit lines, as well as any portion of the cap strips 528, barrier metal strips 526 and nucleation strips 522. The liner may accumulate over the exposed portions of dielectric fill material 306 as depicted and over the upper surface of the cap strips 528. The liner is capable of forming a thin protective film along the sidewalls to prevent further oxidation or nitridation. In one embodiment, the liner is a high-temperature oxide (HTO) formed using a conformal deposition (e.g., ALD) or other process. Tetraethylorthosilicate, Si(OC2H5)4 is used in another embodiment At step 432, a non-conformal cap layer is formed over the substrate. FIG. 8J depicts the results of step 432 in one embodiment. By using a non-conformal deposition process, material 532 will be deposited unequally at the upper portion of the layer stack columns. Material 532 quickly accumulates, meeting at a location over the space between columns to form the bit line air gaps 540. In one embodiment, layer 532 is an oxide but other materials such as nitrides may be used in other implementations. Although not shown, some portion of dielectric 532 may enter the space between bit lines. This portion of the dielectric may raise the lower endpoint of the air gap in the spaces, but by only a small amount. However, a very non-conformal oxide will quickly grow together to seal off the spaces as shown without a substantial decrease in the vertical dimension of the air gap. Although not shown, a polishing step can be applied to form individual caps from layer 532.

In FIG. 8J, the non-conformal cap layer is formed quickly over the exposed horizontal surfaces. As illustrated, the additional cap strip 528, formed over the barrier metal strip increases the aspect ratio of the bit line air gaps 540. The air gaps extend vertically, with respect to the substrate surface, an increased distance due to the additional cap strips 528. The air gaps have an upper endpoint defined by a lower surface of the non-conformal cap layer and a lower endpoint defined by an upper surface of the low-temperature dielectric liner. As earlier described, the liner may not cover the dielectric fill material 556 in some cases such that the lower endpoint of the air gaps will be defined by the upper surface of the dielectric fill material 556.

At step 434, back end processing is completed. FIG. 8K depicts additional processing to form a dielectric layer 534 over the substrate before forming additional metal layers, such as additional via layers. Dielectric layer 534 can insulate the underlying structure for further processing. Dielectric layer 534 can include dTEOS or HDP in various examples, although other materials can be used.

Figure 9C:
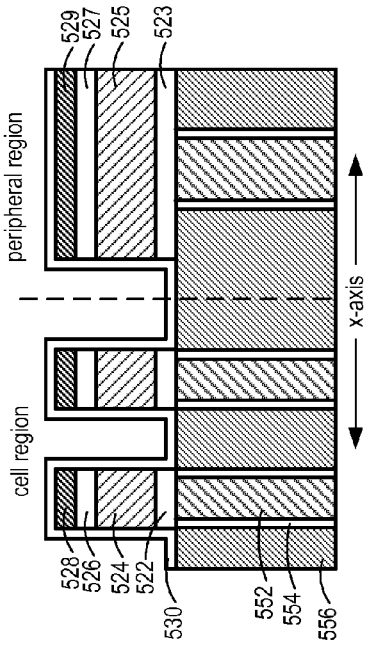

The process of FIG. 7 may be incorporated into various process flows forming additional features. For example, the process may be used while forming peripheral circuitry using the materials formed in FIG. 7. In one embodiment, bit line air gaps are formed at the memory array area, but at the peripheral area metal lines at the same layer may not have air gaps formed. This arrangement may be useful in situations where the increased size of the peripheral metal lines does not provide for as many interference issues. FIGS. 9A-9F are cross-section views through a portion of a memory array depicting integrated processing with peripheral circuitry formation in one embodiment. In FIG. 9A, the memory array is depicted after processing to form a pattern of spacers 521 over the substrate as earlier described. As earlier described, bit line vias 552 have been formed in a dielectric fill material 556, followed by forming a nucleation layer 502, metal layer 504, barrier metal layer 506, cap layer 508, and hard mask layer 510. Sacrificial strips 520 have been formed, including sacrificial strips with a larger dimension in the x-direction at the peripheral region. In the peripheral region, metal vias 551 are also formed in the dielectric fill material 306. These peripheral vias can form contacts to peripheral gate or diffusion regions, for example. The peripheral metal vias have a larger dimension in the x-direction.

In the integrated processing, the sacrificial strips 520 are removed as before. After removing the sacrificial strips, the peripheral region is patterned using standard photolithography to form a protective strip 531 over a target area for the peripheral line to be formed as depicted in FIG. 9B. The protective strip defines the dimension in the x-direction of the subsequently formed metal line at this area. The protective strip may be formed as earlier described for strips 518 and may include an antireflective coating, SOG, etc. After forming the protective strips over targeted peripheral line areas, the hard mask layer and cap layer are etched as also shown in FIG. 9B. The protective strip is then removed followed by etching using the strips of the hard mask layer as a pattern. Reactive ion etching can be used as before to protect the metal lines from contaminants, etc. FIG. 9C depicts the results of etching to form metal bit lines 524 as earlier described. Etching at the peripheral region forms metal peripheral lines 525 having a larger dimension in the x-direction. The layer stack column at the peripheral region includes a nucleation line 522, barrier metal line 527 and cap line 529.

Figure 9D:
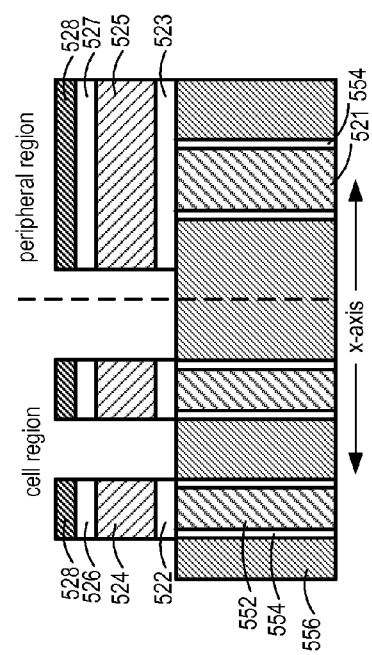
Figure 9E:
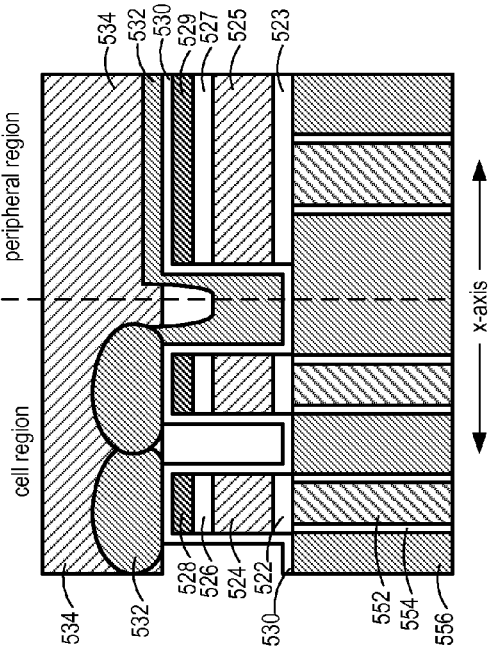
Figure 9F:
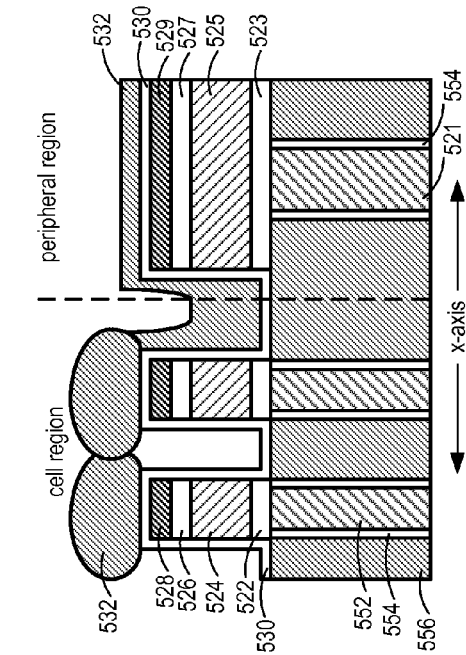

A low temperature sidewall dielectric liner 530 is then formed as shown in FIG. 9D. The liner protects the sidewalls of the layer stack columns at the cell region and peripheral region from oxidation during later processing. After forming the liner, a non-conformal cap layer is again formed to define the upper endpoint regions for the metal bit line air gaps. FIG. 9E depicts the formation of the non-conformal film 530 in one example. As illustrated, the spacing between the metal bit lines and an adjacent peripheral transistors is greater than the distance between adjacent bit lines. In practice, the distance may be greater than is illustrated. The non-conformal film fills the space between the metal bit line and peripheral line in FIG. 9E. Because of the additional accumulation in this space, no air gap is formed adjacent to the peripheral line. Additionally, the accumulation of the non-conformal film may be less above the peripheral line, resulting in a difference in topography at the peripheral region and cell region. FIG. 9F depicts the formation of a dielectric layer such as dTEOS or a high density plasma oxide than can compensate for the differences in topography resulting from a thicker accumulation of the non-conformal film at the peripheral region. In one embodiment, the dielectric layer can be deposited and then etched-back or polished by CMP to create a substantially planar upper surface for further processing.

Thus, one embodiment includes a non-volatile memory system having a plurality of metal vias. Each metal via is electrically coupled to a drain region of one of a plurality of groups of non-volatile storage elements. The system includes a plurality of layer stack columns extending in a column direction over the plurality of metal vias. Each layer stack column includes a nucleation line in contact with at least one of the plurality of metal vias, a metal bit line in contact with the strip of nucleation material, and a cap line over the metal bit line. Each layer stack has sidewalls extending in the column direction. The system includes a low temperature dielectric liner extending along the sidewalls of the plurality of layer stack columns, a non-conformal cap layer overlying the plurality of layer stack columns and a plurality of air gaps extending in the column direction between adjacent layer stack columns.

One embodiment includes a method of fabricating non-volatile storage that includes forming over a plurality of metal vias a nucleation layer, a metal bit line layer, a cap layer, and a hard mask layer. The method includes etching the hard mask layer in a wet etch process to form a plurality of hard mask lines extending in a first direction. In a reactive ion etching process using the hard mask layer as a pattern, the cap layer, metal bit line layer and nucleation layer are etched into a plurality of layer stack columns extending in the first direction. The method includes forming a low temperature liner along sidewalls of the metal bit line layer and the cap layer and forming a non-conformal cap layer over the plurality of layer stack columns. The non-conformal cap layer forms a plurality of air gaps between adjacent layer stack columns.

One embodiment includes a non-volatile memory system, comprising a plurality of NAND strings having a plurality of storage elements between a source and a drain and a plurality of metal vias. Each metal via is electrically coupled with the drain region of one of the plurality of NAND strings. The system includes a plurality of layer stack columns having sidewalls extending in a first direction over the plurality of NAND strings. Each layer stack column includes a strip of nucleation material in contact with at least one metal via, a metal bit line in contact with the strip of nucleation material, and a cap line over the metal bit line. The system further includes a low temperature dielectric liner extending along the sidewalls of the plurality of layer stack columns, a non-conformal cap layer overlying the plurality of layer stack columns, and a plurality of air gaps extending in the first direction between adjacent layer stack columns.

Figure 10:
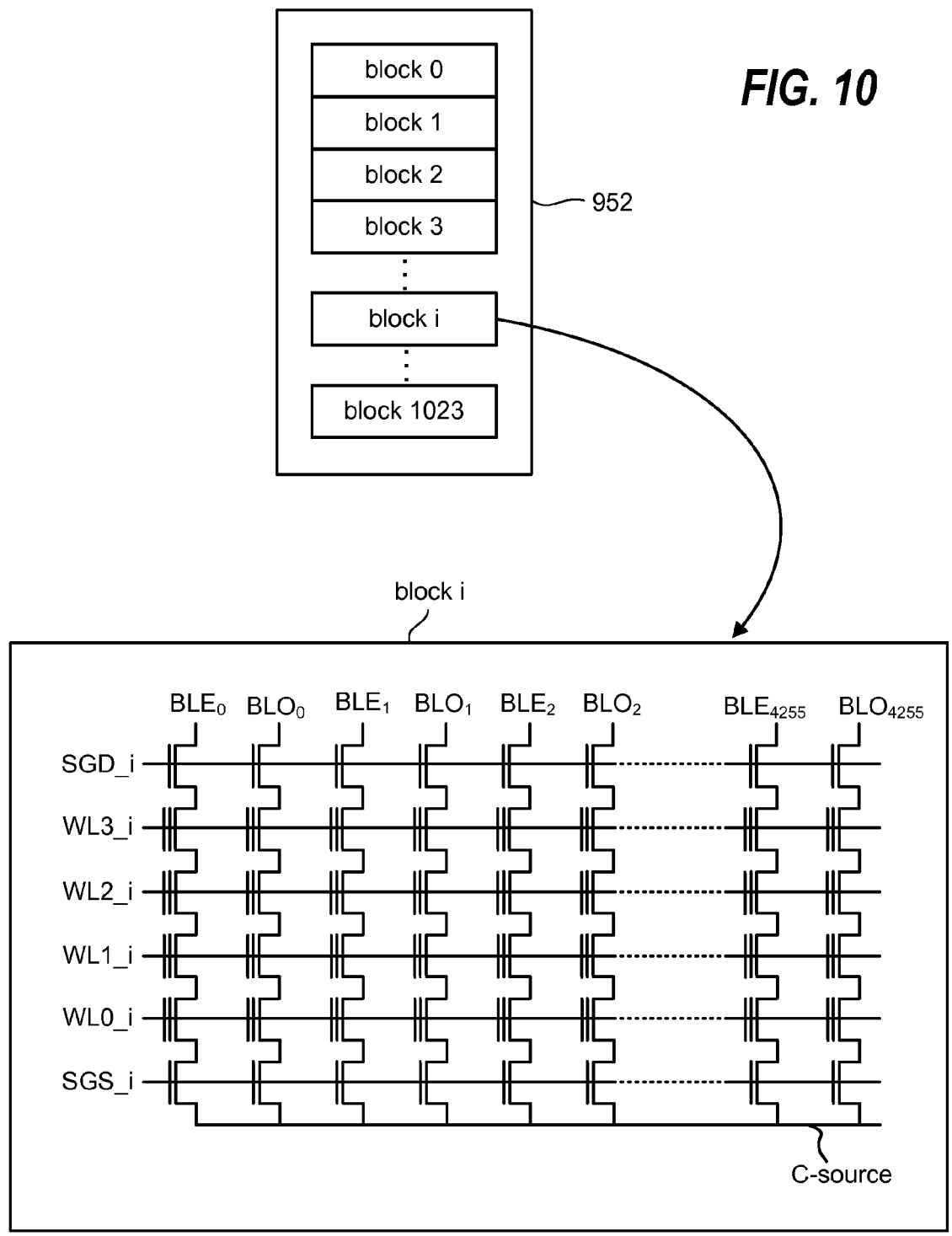
FIG. 10 depicts an example of the organization of a memory array in accordance with one embodiment.

FIG. 10 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 10 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 11:
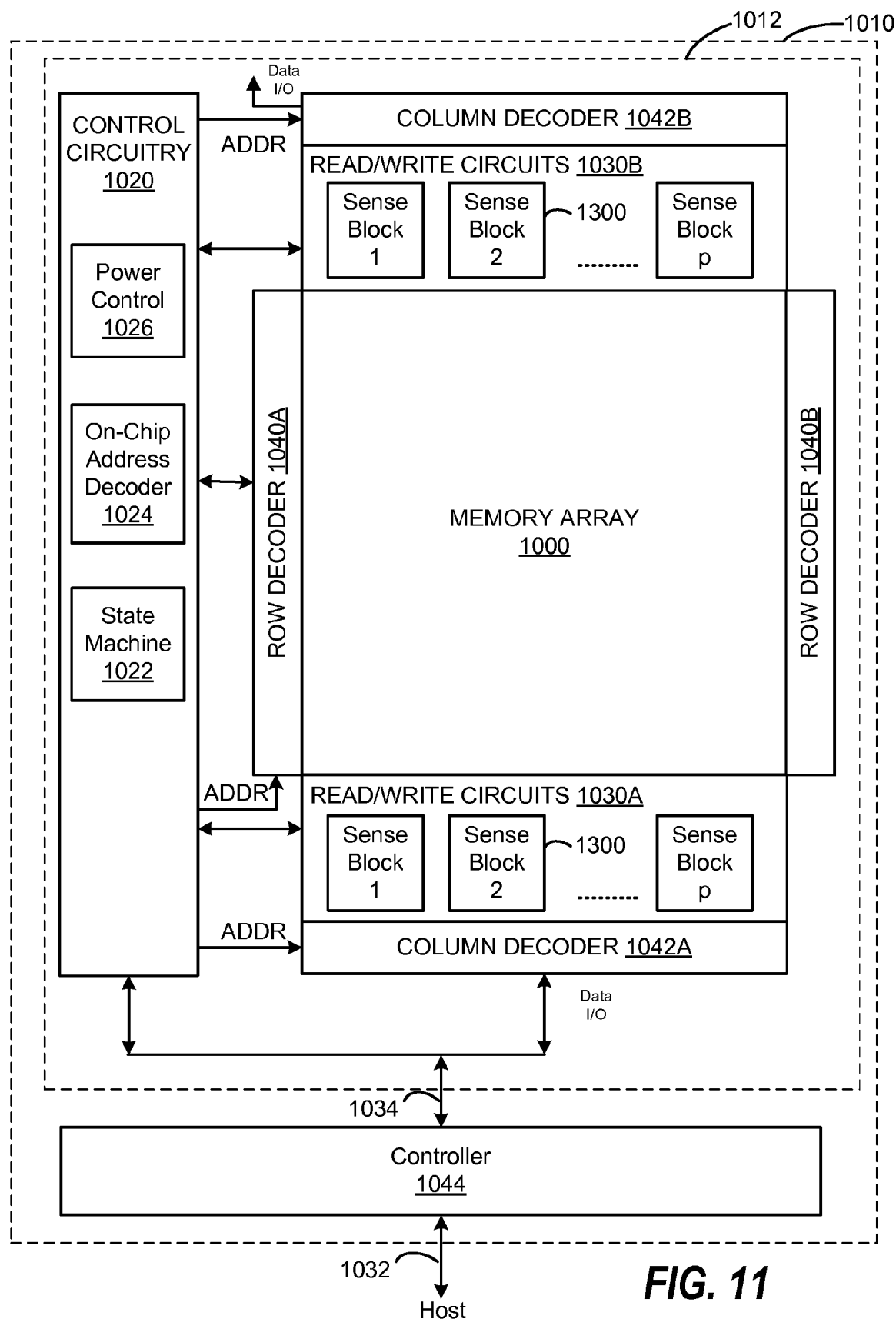
FIG. 11 is a block diagram depicting an example of a memory system that can be fabricated or used to implement embodiments of the disclosed technology.

FIG. 11 illustrates a non-volatile storage device 1010 that may include one or more memory die or chips 1012. Memory die 1012 includes an array (two-dimensional or three-dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 12:
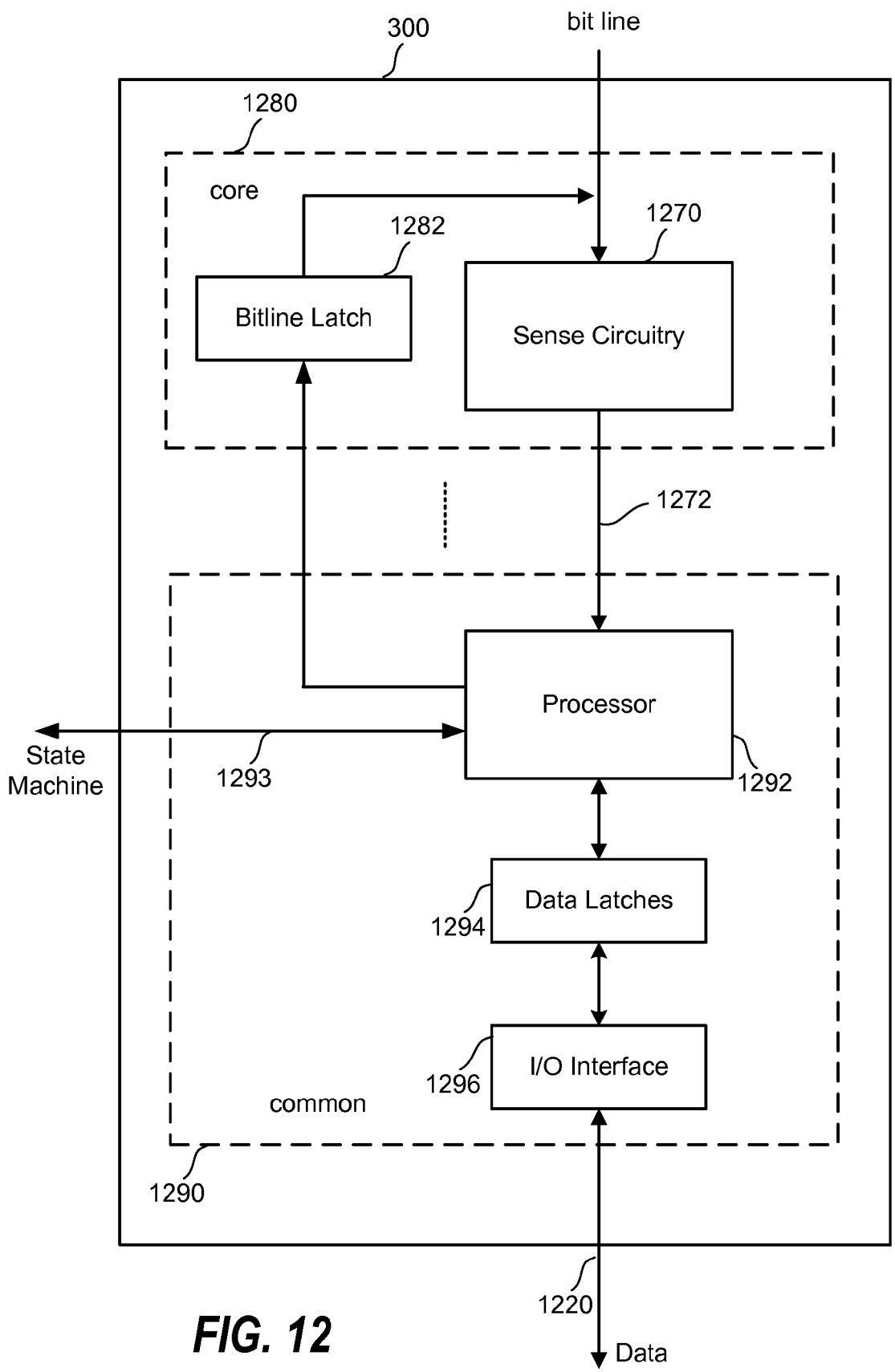
FIG. 12 is a block diagram depicting one embodiment of a sense block.

FIG. 12 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation.

The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile memory system, comprising:
a plurality of metal vias, each metal via electrically coupled to a drain region of one of a plurality of groups of non-volatile storage elements;
a plurality of layer stack columns extending in a column direction over the plurality of metal vias, each layer stack column includes a metal nucleation line in contact with at least one of the plurality of metal vias, a metal bit line in contact with the metal nucleation line, and a cap line over the metal bit line, each layer stack column including sidewalls extending in the column direction;
a low temperature dielectric liner extending along the sidewalls of the plurality of layer stack columns;
a non-conformal cap layer overlying the plurality of layer stack columns; and
a plurality of air gaps extending in the column direction between adjacent layer stack columns.

2. A non-volatile memory system according to claim 1, wherein:
the metal bit line of each layer stack column is formed of tungsten; and
the metal nucleation line of each layer stack column is formed of tungsten nitride.

3. A non-volatile memory system according to claim 2, wherein:

each layer stack line includes a barrier metal line having a lower surface in contact with the metal bit line and an upper surface in contact with the cap line.

4. A non-volatile memory system according to claim 3, wherein:
the barrier metal line is titanium nitride; and
the cap line is silicon nitride.

5. A non-volatile memory system according to claim 1, wherein:
each air gap has an upper endpoint defined by a lower surface of the non-conformal cap layer; and
each air gap has a lower endpoint defined by an upper surface of the low temperature dielectric liner.

6. A non-volatile memory system according to claim 1, wherein:
each air gap has an upper endpoint defined by a lower surface of the non-conformal cap layer; and
each air gap has a lower endpoint defined by the upper surface of the substrate.

7. A non-volatile memory system according to claim 1, wherein the plurality of metal vias is a plurality of metal upper vias, the system further comprising:
a plurality of metal pads, each metal pad having an upper surface in contact with one of the metal upper vias; and
a plurality of lower vias, each lower via having an upper surface in contact with a lower surface of one of the metal pads and a lower surface in contact with the drain region of one of the plurality of groups of non-volatile storage elements.

8. A non-volatile memory system according to claim 1, wherein:
each group of non-volatile storage elements is a NAND string.

9. A non-volatile memory system, comprising:
a plurality of NAND strings having a plurality of storage elements between a source and a drain;
a plurality of metal vias, each metal via electrically coupled to the drain region of one of the plurality of NAND strings;
a plurality of layer stack columns having sidewalls extending in a first direction over the plurality of NAND strings, each layer stack column including a strip of nucleation material in contact with at least one metal via, a metal bit line in contact with the strip of nucleation material, and a cap line over the metal bit line, wherein the strip of nucleation material of each layer stack column includes a metal;
a low temperature dielectric liner extending along the sidewalls of the plurality of layer stack columns;
a non-conformal cap layer overlying the plurality of layer stack columns; and
a plurality of air gaps extending in the first direction between adjacent layer stack columns.

10. A non-volatile memory system according to claim 9, wherein:
the metal bit line of each layer stack column is formed of tungsten; and
the strip of nucleation material is formed of tungsten nitride.

11. A non-volatile memory system according to claim 10, wherein:
each layer stack column includes a barrier metal line having a lower surface in contact with the metal bit line and an upper surface in contact with the cap line.

12. A non-volatile memory system according to claim 11, wherein:
the barrier metal line is titanium nitride; and
the cap line is silicon nitride.

13. A non-volatile memory system according to claim 9, wherein:
each air gap has an upper endpoint defined by a lower surface of the non-conformal cap layer; and
each air gap has a lower endpoint defined by an upper surface of the low temperature dielectric liner.

14. A non-volatile memory system according to claim 9, wherein:
each air gap has an upper endpoint defined by a lower surface of the non-conformal cap layer; and
each air gap has a lower endpoint defined by the upper surface of the substrate.

15. A non-volatile memory system according to claim 9, wherein the plurality of layer stack columns is a first plurality of layer stack columns at a cell region of a substrate and the plurality of metal vias is a first plurality of metal vias, the non-volatile memory system further comprising:
a second plurality of metal vias formed at a peripheral region of the substrate, the second plurality of metal vias having a dimension in a second direction orthogonal to the first direction that is larger than a dimension of the first plurality of metal vias in the second direction;
a second plurality of layer stack columns formed at the peripheral region of the substrate, the second plurality of layer stack columns having a dimension in the second direction that is larger than a dimension of the first plurality of layer stack columns in the second direction; and
a dielectric fill material extending in the first direction between a first layer stack column of the first plurality of layer stack columns and a first layer stack column of the second plurality of layer stack columns.

16. A non-volatile memory system, comprising:
a plurality of NAND strings having a plurality of storage elements between a source and a drain;
a plurality of upper metal vias coupled to the drain region of one of the plurality of NAND strings;
a plurality of layer stack columns extending in a column direction over the plurality of upper metal vias, each layer stack column includes a metal nucleation line forming a contact between at least one of the plurality of upper metal vias and a metal bit line, each layer stack column includes sidewalls extending in the column direction;
a low temperature dielectric liner extending along the sidewalls of the plurality of layer stack columns;
a non-conformal cap layer overlying the plurality of layer stack columns; and
a plurality of air gaps extending in the column direction between adjacent layer stack columns.

17. A non-volatile memory system according to claim 16, wherein:
the metal bit line of each layer stack column is formed of tungsten; and
the metal nucleation line of each layer stack column is formed of tungsten nitride.

18. A non-volatile memory system according to claim 17, wherein:
each layer stack line includes a barrier metal line having a lower surface in contact with the metal bit line and an upper surface in contact with the cap line.

19. A non-volatile memory system according to claim 18, wherein:
the barrier metal line is titanium nitride; and
the cap line is silicon nitride.

20. A non-volatile memory system according to claim 16, wherein:
each air gap has an upper endpoint defined by a lower surface of the non-conformal cap layer; and
each air gap has a lower endpoint defined by an upper surface of the low temperature dielectric liner.

21. A non-volatile memory system according to claim 16, further comprising:
a three-dimensional non-volatile memory array in communication with the metal bit line.

* * * * *